United States Patent [19]
Doscher

[11] Patent Number: 5,690,747
[45] Date of Patent: Nov. 25, 1997

[54] METHOD FOR REMOVING PHOTORESIST WITH SOLVENT AND ULTRASONIC AGITATION

[75] Inventor: Patrisha A. Doscher, Kent, Wash.

[73] Assignee: The Boeing Company, Seattle, Wash.

[21] Appl. No.: 465,644

[22] Filed: Jun. 5, 1995

Related U.S. Application Data

[62] Division of Ser. No. 700,044, May 19, 1991, abandoned, which is a continuation of Ser. No. 354,529, May 19, 1989, abandoned, which is a continuation-in-part of Ser. No. 196,903, May 19, 1988, Pat. No. 5,007,969.

[51] Int. Cl.$^6$ .................. B08B 3/12; C23G 5/02
[52] U.S. Cl. .................. 134/1; 134/1.3; 134/31; 134/38; 134/40; 510/176
[58] Field of Search .................. 134/1, 38, 40, 134/1.3; 252/170, 171, 364, DIG. 8; 430/329, 331; 510/176, 201, 365, 405

[56] References Cited

U.S. PATENT DOCUMENTS

| | | | |
|---|---|---|---|
| 2,071,920 | 2/1937 | Wurmbock | 252/143 |
| 2,932,618 | 4/1960 | Oberdorfer | 252/143 |
| 2,935,479 | 5/1960 | Oberdorfer | 252/170 |
| 3,150,048 | 9/1964 | Hollub | 424/61 |
| 3,382,181 | 5/1968 | Oberdorfer | 252/170 |
| 3,737,386 | 6/1973 | Geiss | 252/162 |
| 3,796,602 | 3/1974 | Briney et al. | 134/38 |
| 4,508,634 | 4/1985 | Elepano et al. | 252/163 |
| 4,594,111 | 6/1986 | Coonan | 134/3 |
| 4,617,251 | 10/1986 | Sizensky | 430/256 |
| 4,645,617 | 2/1987 | Vivian | 252/165 |
| 4,680,133 | 7/1987 | Ward | 252/153 |
| 4,781,916 | 11/1988 | Papaphilippou | 424/61 |
| 4,791,043 | 12/1988 | Thomas et al. | 430/256 |
| 4,801,331 | 1/1989 | Murase | 106/5 |
| 4,822,723 | 4/1989 | Dhillon | 430/331 |
| 5,098,594 | 3/1992 | Doscher | 252/162 |

OTHER PUBLICATIONS

Bellamy et al. *Infra-red Spectra and Solvent Effects, Part 2.—Carbonyl Absorptions*, Trans. Farad. Soc. 55, pp. 14–18 (1959).

Maroncelli et al., *Polar Solvent Dynamics and Electron–Transfer Reactions*, Sci., vol. 243, pp. 1674–1680 (31 Mar. 1989).

Primary Examiner—Jill Warden
Assistant Examiner—Saeed Chaudhry
Attorney, Agent, or Firm—John C. Hammar

[57] ABSTRACT

Liquid solvents having superior cleaning power include at least one polar compound having at least one strongly electronegative oxygen, such as ethylene diacetate, and at least one alicyclic carbonate, such as ethylene carbonate, with or without other additives. The solvents exhibit low toxicity; are nonflammable, pH neutral, essentially nonvolatile, and aprotic; and have other chemical and physical properties that reduce the risk of exposing the user unnecessarily to hazardous conditions. Solvents comprising ethylene carbonate, ethylene diacetate, and, optionally, triethanolamine and/or N-methyl-2-pyrrolidone are superior cleaners for a wide range of residues and are environmentally and physiologically safe.

7 Claims, 11 Drawing Sheets

METHOD FOR REMOVING PHOTORESIST WITH SOLVENT AND ULTRASONIC AGITATION

REFERENCE TO RELATED APPLICATIONS

This application is a divisional application based upon U.S. patent application Ser. No. 07/700,044, filed May 7, 1991, now abandoned, which was a continuation application based upon U.S. patent application Ser. No. 07/354,529, filed May 19, 1989, now abandoned, which was a continuation-in-part application based upon U.S. patent application Ser. No. 07/196,903, filed May 20, 1988, now U.S. Pat. No. 5,007,969.

TECHNICAL FIELD

The present invention relates to an ultrasonic cleaning method using liquid organic solvents, and, more particularly, to aprotic solvents designed to replace MEK and other hazardous solvents presently in widespread use.

BACKGROUND OF THE INVENTION

Solvent cleaning is generally accomplished today using a variety of highly or moderately toxic or corrosive solvents. Because of the growing concerns for personal safety and health and for the environment, federal and state governments are promulgating increasingly stringent compliance criteria for solvent manufacturers and users to ensure the health and safety of those working with and around such solvents and to ensure environmentally-sound disposal of wastes that are created. For instance, California limits the use of volatile solvents by requiring that they have a vapor pressure below about 45 mm Hg at 20° C. For many users, disposal (because the wastes are hazardous) generally translates into significantly increased costs that are not reflected in the material cost for the solvent.

Although personal safety can be promoted primarily by preventing direct contact and exposure to hazardous solvents or by limiting exposure below published thresholds, such precautions do not account for accidents or individual sensitivities. The flammability, volatility, cleaning ability, stability during storage, and odor are other factors that the user must also consider in choosing a particular solvent.

One solvent that has found widespread application in industrial applications is methylethylketone (MEK). Although MEK is generally considered a satisfactory solvent from a cleaning effectiveness standpoint, there is a growing concern that the toxicity and flammability of MEK exposes users to unnecessary risks. Its volatility raises environmental concerns, especially in areas where photochemical smog is a problem. Moreover, the expense associated with the safe disposal of MEK wastes is often about 5 to 10 times the material cost for MEK, thereby making MEK an expensive solvent to use.

Increasing efforts are being devoted to developing substantially nontoxic solvents that exhibit low flammability, low volatility, and superior cleaning ability over a wide range of debris; have a pleasant odor or are odorless; are stable during storage; and are readily disposable or recoverable. Such solvents will be safe to use not only in large scale industrial applications, but also on the much smaller scale encountered in every day household cleaning chores.

SUMMARY OF THE INVENTION

An ultrasonic cleaning method of the present invention uses a howl carbonate-polar solvent mixture to achieve widespread cleaning efficacy, especially removal of photoresist, with reduced environmental impact. The liquid solvent is aprotic, exhibits low toxicity and low volatility, and provides superior cleaning ability, thereby meeting or exceeding the new environmental and safety criteria for solvents. The solvent generally includes a mixture of an alicyclic carbonate (particularly ethylene carbonate) and a polar compound having at least one strongly electronegative oxygen and selected from the group consisting of alkyl diethers, alkyl diesters, alkyl compounds containing both ester and ether groups, and mixtures thereof. The preferred alicyclic carbonate, ethylene carbonate, normally is a solid at room temperature, but it dissolves in the polar compound. A preferred polar compound is ethylene diacetate. The polar compound, therefore, forms a liquid mixture at room temperature with the alicyclic carbonate by depressing its freezing point. When the preferred ethylene carbonate and ethylene diacetate are mixed in about equal volumes, a eutectic mixture is formed that has enhanced handling and reclaiming properties.

The solvent of the present invention can be combined with other additives to form further improved solvents, for example, to reduce the surface tension of the solvent, to increase its ability to clean greases, oils or other residues, or to reduce its aggressiveness for acrylics or other solvent-sensitive plastics. Preferred additives include ethylene dibutyrate, triethanolamine (TEA), or N-methyl-2-pyrrolidone (NMP).

The solvent effectively removes residues (such as oils, greases, epoxy resins, organic adhesives, waxes, photoresist, inks, fingernail enamel, or non-polymeric paints or coatings, particularly evaporative drying finishes (like shellac, lacquer, or varnish) from solid substrates including wood, plastic, metal, or ceramics.

The preferred solvent is essentially nonflammable and has a vapor pressure that is well below the allowable maximum that governmental agencies have contemplated for or established (as a compliance standard). The nonhazardous nature of the solvent reduces or eliminates apprehension that users normally associate today with the use of the conventional solvents that have recently been drawn into question. The preferred solvent of the present invention, thus is virtually odor free and stable under storage conditions. Further, the increasing costs normally associated with the disposal of toxic or hazardous substances are circumvented or reduced because the debris-filled solvent of the present invention can be recovered or disposed of by less costly means than are required for hazardous wastes. Being aprotic, it is noncorrosive.

Other objects, features, and advantages of the present invention will be readily apparent from the following description of its preferred embodiments. Variations and modifications may be affected without departing from the spirit and scope of the novel concepts of the present invention.

DETAILED DESCRIPTION OF THE INVENTION

Figure 1:
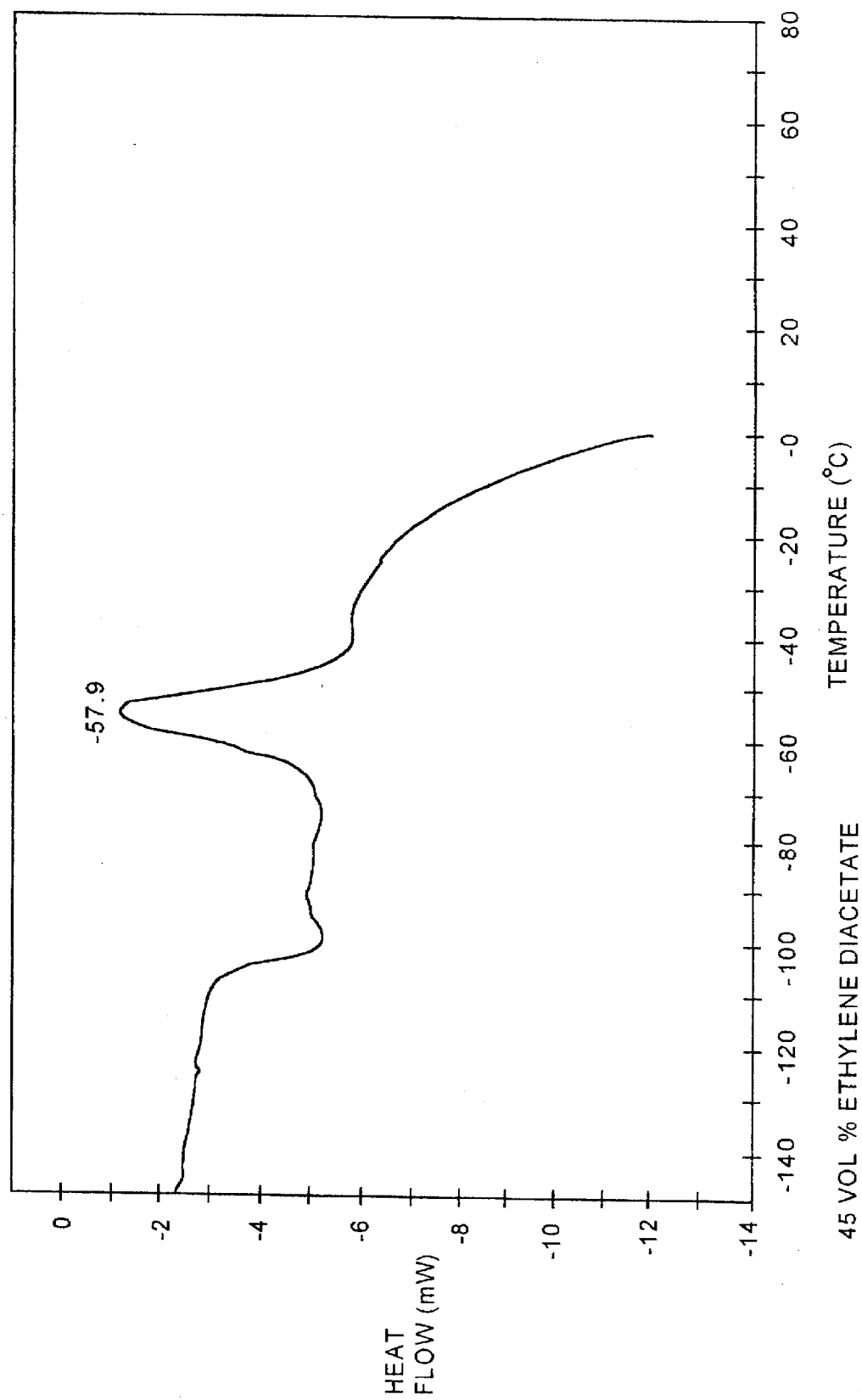
FIGS. 1 through 11 illustrate differential scanning calorimetry analyses of different formulations of a preferred solvent of the present invention.
Figure 2:
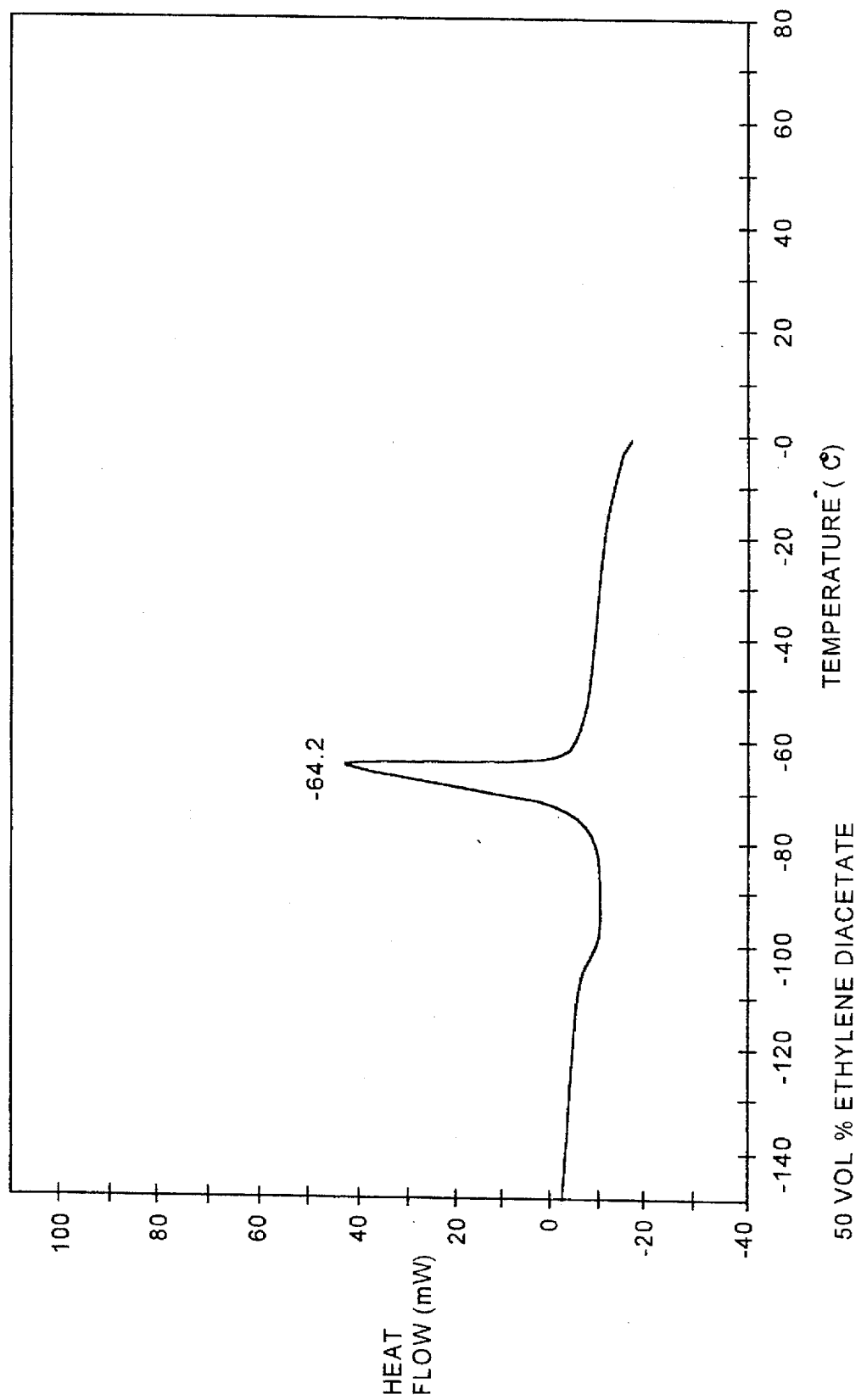
Figure 3:
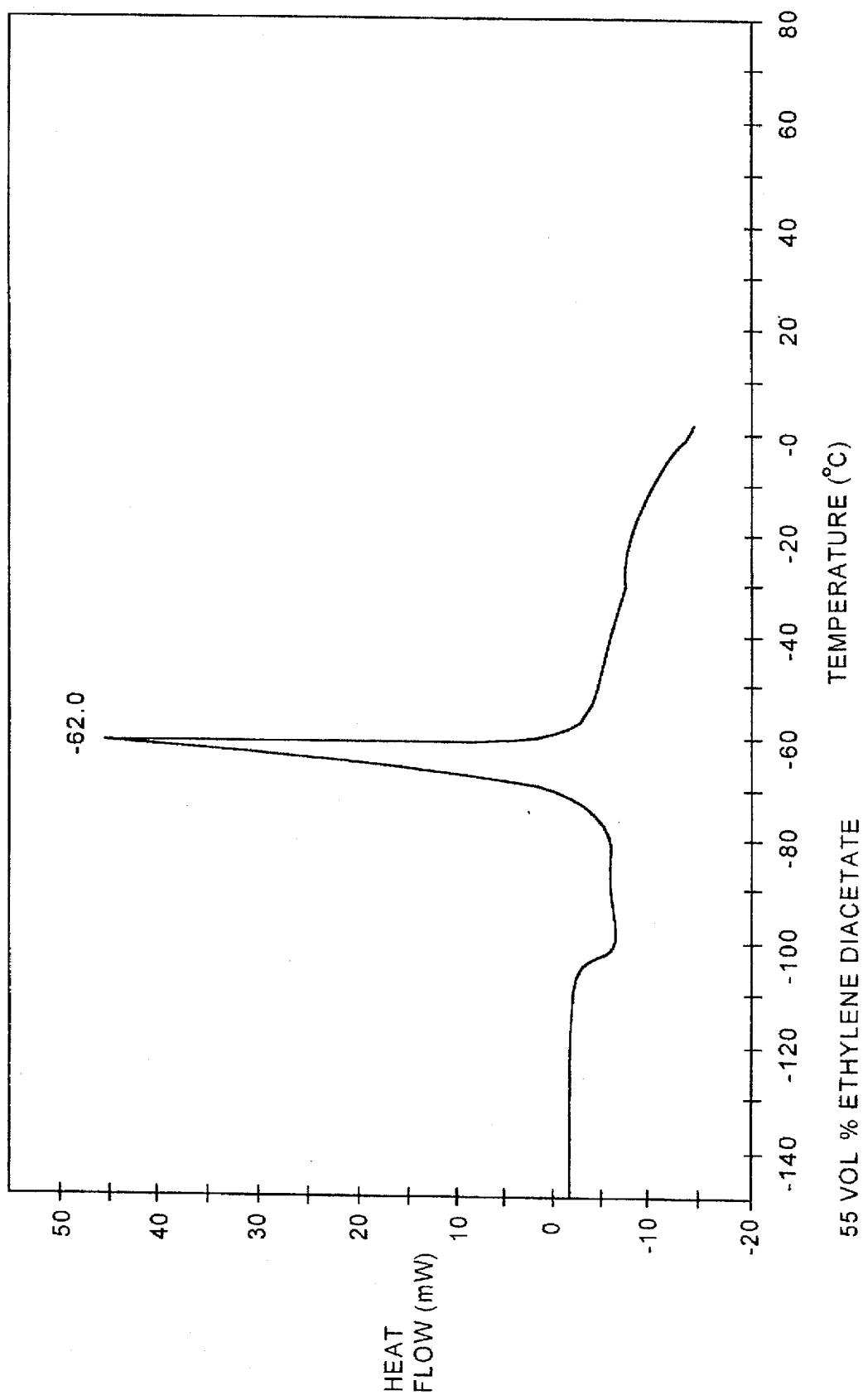
Figure 4:
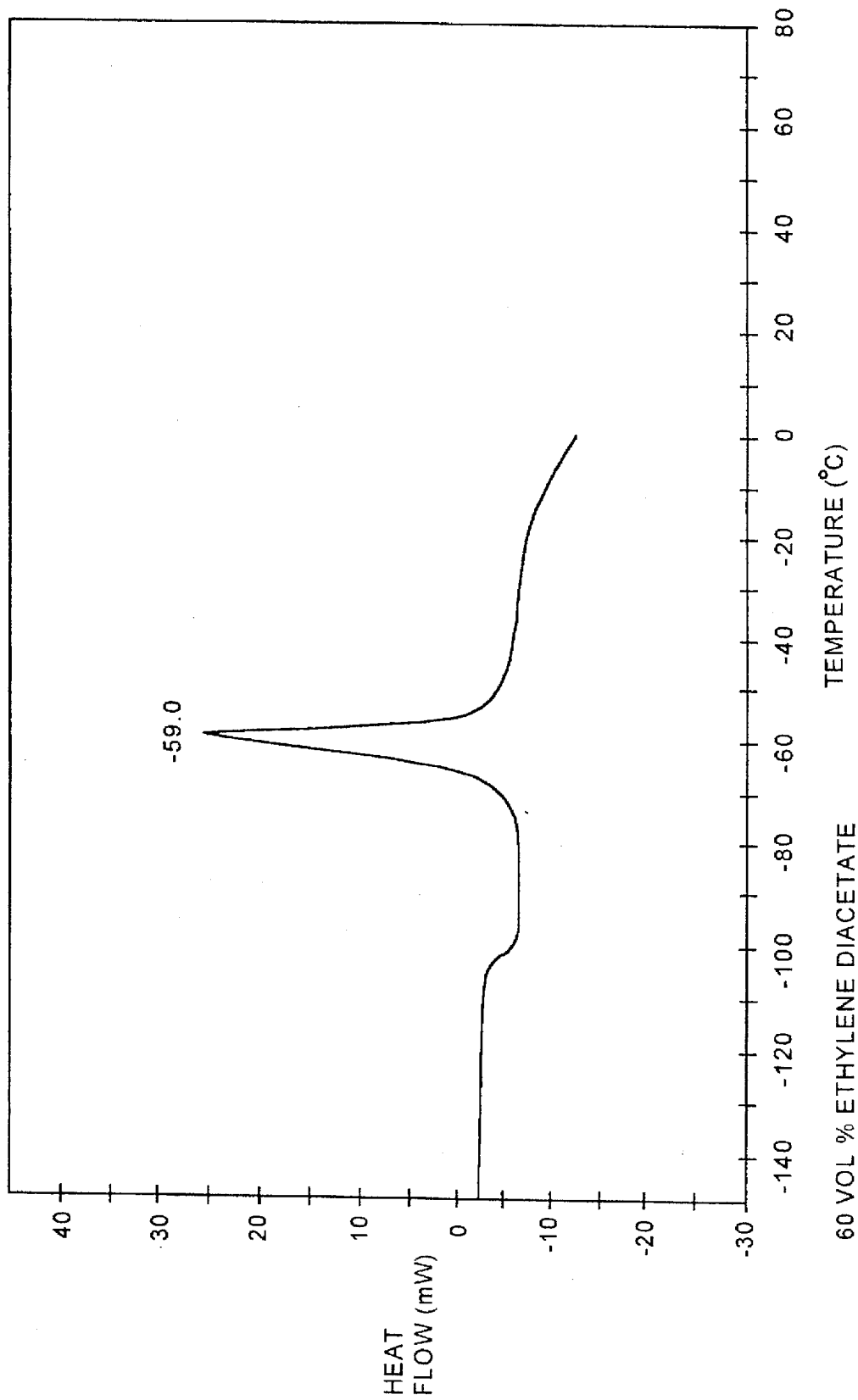
Figure 5:
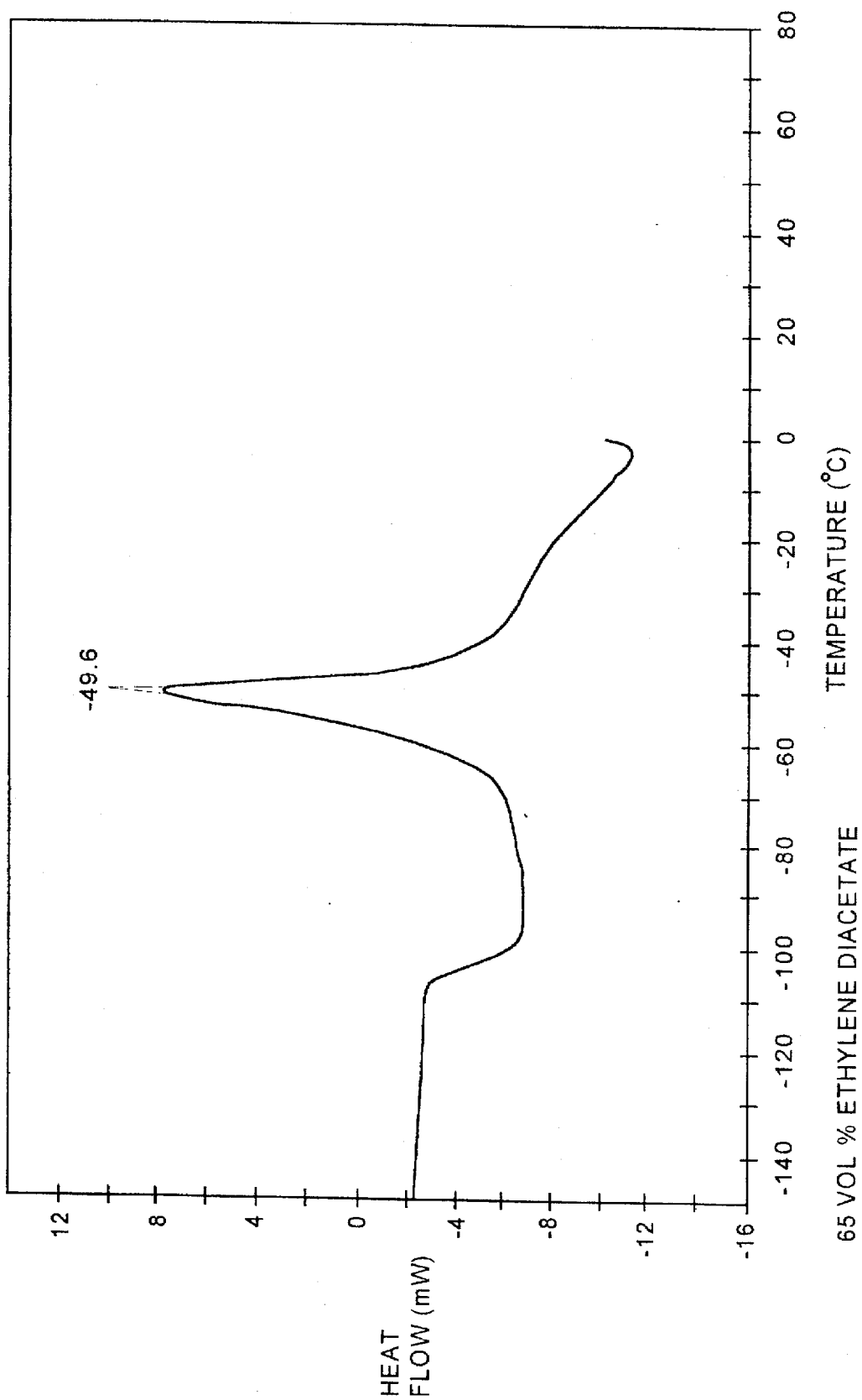
Figure 6:
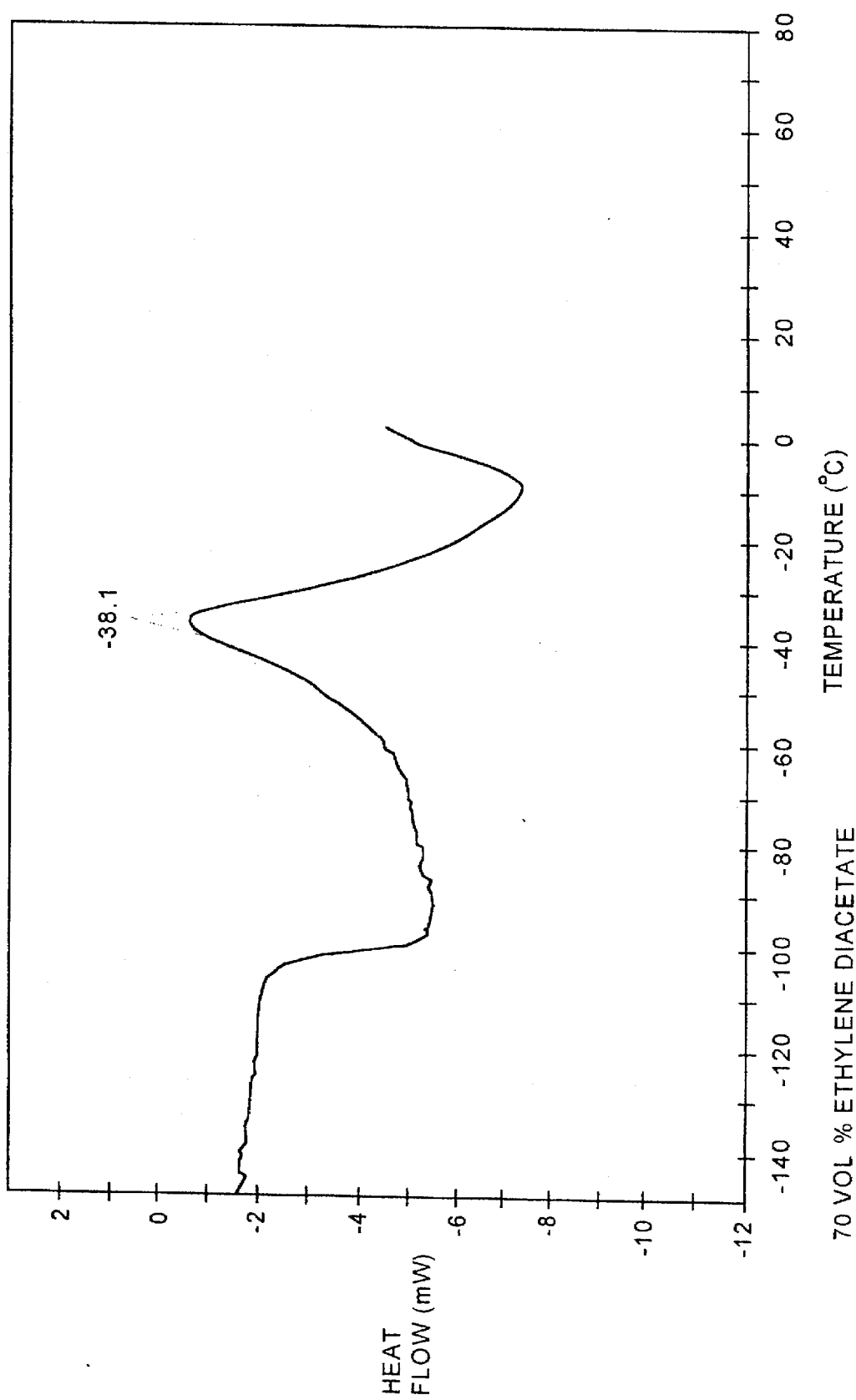
Figure 7:
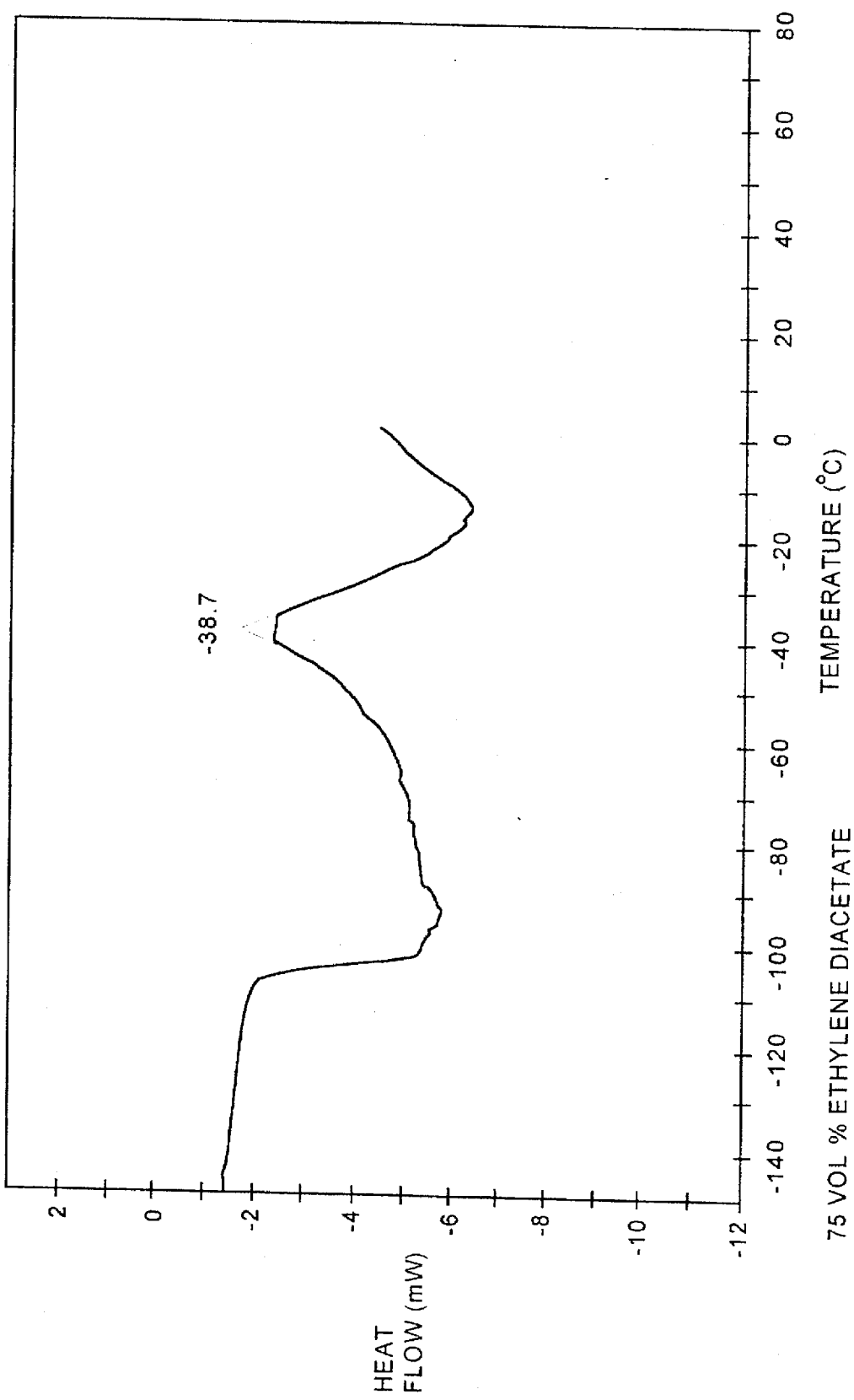

A particularly effective aprotic, liquid solvent that exhibits low toxicity and low volatility is provided by a mixture of an aliphatic carbonate and a polar compound having a strongly electronegative oxygen and selected from the group consisting of alkyl diethers, alkyl diesters, alkyl compounds containing both ester and ether groups, and mixtures thereof.

Preferably the aliphatic carbonate is a saturated hydrocarbon, particularly an alicyclic carbonate such as ethylene carbonate. Diesters are preferred for the polar compound over either diethers or ether/esters.

The solvent should be aprotic so that it will not be corrosive to metal substrates. This criterion is particularly important for aerospace applications where aluminum is used to reduce weight but where its integrity is highly dependent upon being free from corrosion. By "aprotic," we mean that the solvent lacks compounds that are readily able to donate or lose a proton, such as organic acids. The preferred solvent of the present invention, in addition, is generally free of water or any groups that have hydrogen atoms bonded to heteroatoms (i.e., oxygen, nitrogen, or sulfur). We have found, nevertheless, that alcohols can often be used without significantly increasing the corrosiveness of the solvent. The alcoholic hydroxyl group is aprotic.

The solvent has low toxicity to promote its utility as a cleaner in handwipe situations and to reduce its overall costs. Hazardous or toxic wastes are a major environmental concern and require extraordinary handling for safe disposal.

The preferred solvent has low volatility for both the safety of the workers and the environment.

A mixture of ethylene diacetate and ethylene carbonate in all proportions, but preferably substantially a eutectic composition of between about 50–60 vol % (and preferably 50–55 vol %) ethylene diacetate, provides a liquid solvent with a superior combination of properties. Generally, mixtures of this type exhibit a freezing point depression for the ethylene carbonate component, and are liquids at ambient temperature. For instance, ethylene carbonate normally freezes at about 36.4° C. When mixed with ethylene diacetate or the other polar compounds of the present invention, however, the resulting mixture is a liquid at or below ambient temperatures (i.e., about 20° C.). Being a liquid at ambient temperatures makes the solvent easily usable in most industrial cleaning applications where the carbonate, normally being a solid, otherwise would be difficult or impossible to use.

The polar compounds which are useful in the present invention are generally of the type that include at least one (and generally two) strongly electronegative oxygen (generally a carbonyl) capable of complexing in solution with the alicyclic carbonate and of dissolving debris or residues during cleaning. In solution, we believe that the affinity between the electronegative oxygens of the polar compound and the alicyclic carbonate is stronger than the affinity between adjacent alicyclic carbonate molecules. Thus, the polar compounds are able to complex with the alicyclic carbonates under conditions at which the alicyclic carbonate otherwise would be a solid. This belief is supported by consideration of hydrogen bonding (and its resulting stabilizing energy) that is promoted by the polar compound.

The polar compound preferably is selected from alkyl diesters, alkyl diethers, or alkyl compounds containing both an ester and an ether group, or mixtures thereof. Each polar compound of this type actually has at least two strongly electronegative oxygens. The most preferred polar compounds are the alkyl diesters and alkyl diethers which are symmetric or nearly symmetric. Examples of these symmetric polar compounds include ethylene diacetate, ethylene dibutyrate (i.e., alkylene dialkylates), ethylene glycol diethyl ether, ethylene glycol dimethyl ether (i.e., alkylene glycol dialkyl ethers), butyl diglycol carbonate, and dimethyl glutarate. A preferred symmetric polar compound is ethylene diacetate.

Although asymmetric compounds may be used, the symmetric polar compounds are preferred because of their stronger electronegative oxygens compared to the electronegativity of the oxygens in the asymmetric compounds. Examples of asymmetric polar compounds include ethylene glycol monoacetate and ethyl-3-ethoxy-propionate. Preferably, the polar compound is saturated so that the oxygens are free to rotate, thereby enabling them to complex readily with (through hydrogen bonding) or to dissolve both the alicyclic carbonate and the residue.

Ketones are also candidates for the polar solvent, although we prefer ethylene diacetate for its overall properties.

The aprotic solvent of the present invention generally includes a mixture of an alicyclic carbonate and a dipolar alkyl diether or diester (particularly a eutectic mixture of ethylene carbonate and ethylene diacetate) which combines an exposed (carbonyl) oxygen on the alicyclic carbonate with the solvent properties of the dipolar diether or diester, particularly the double carbonyls of the symmetric diester, ethylene diacetate.

As will be illustrated, in part, in the examples, compounds having at least two electronegative oxygens (especially diesters) are preferred and outperform single esters or ethers. First, symmetry of the carrier solvent is lost in a single ester and the single ester is not as effective as dissolving the ethylene carbonate. Second, fewer sites are available for hydrogen bonding with either the carbonate or the residue and solvency (cleaning power is lost).

Throughout this specification, "residue" is used to refer to the material upon which the solvent acts to affect the desired cleaning. "Residue" is often used interchangeably with "debris."

The preferred solvent of ethylene carbonate and ethylene diacetate, nevertheless, suffers in its cleaning ability for greases and oils, which, we believe occurs principally because the solvent lacks any significant lipophilic elements. That is, the diacetate and carbonate lack any saturated hydrocarbon segments of appreciable length or MW, and neither, accordingly, resemble oils. Therefore, for removal of greases and oils, without significant degrading of the important and advantageous toxicological and environmental properties of the solvent; ethylene dibutyrate can be substituted for the ethylene diacetate or used in conjunction with it (up to about 25 vol %) to provide an adequate and improved degreaser. Alternatively, triethanolamine (TEA) and N-methyl-2-pyrrolidone (NMP) in about 5–10 vol % proportions can be used together or separately with the ethylene carbonate/ethylene diacetate mixture to remove greases. We have found ethylene dibutyrate, TEA, and NMP to be beneficial additives using as little as 5 vol % of the additive and the remainder the eutectic mixture of the preferred solvent. A mixture of 5 vol % TEA/5 vol % NMP and the remainder carbonate/ diacetate mixture has broad solvency with relatively low surface tension and outstanding aggressiveness for residues, including nonpolar species. It is one of the best and most versatile solvents we have tested, and it satifies the most stringent environmental and safety criteria. Other lipophilic additives (as will be discussed) can be added to the solvent.

Aggressiveness and cleaning power for removing or softening polymeric paints can be achieved by using the preferred solvent in conjunction with a low molecular weight organic acid, such as formic or acetic acid, and, particularly, about 50 vol % glacial acetic acid, but this solution is not preferred for general application. The introduction of an acid eliminates the aprotic character of the solvent, and potentially limits the uses of the resulting mixtures. For stripping polymeric paints, such as epoxies, however, we have found the acetic acid/ethylene carbonate/ethylene diacetate mixture to be effective. Evaporative finishes (such as varnish, lacquer, or shellac) can be stripped with the preferred solvent alone. Acrylic paints commonly used in the automotive industry are also stripped readily with the eutectic mixture alone.

Ethylene diacetate is a colorless liquid that exhibits a faint odor and is soluble in water in amounts up to about 10%. The boiling point of ethylene diacetate is 190.5° C., and its freezing point is −41.5° C. The vapor pressure exhibited by ethylene diacetate at 20° C. is 0.3 mm Hg and its flashpoint is 96.4° C. Ethylene diacetate is generally considered a low-toxicity solvent for solvent-sensitive materials, such as cellulose esters and ethers, resins, lacquers, and printing inks.

Ethylene carbonate, the preferred alicyclic carbonate, is an essentially colorless, odorless solid with a freezing point of 36.4° C., a boiling point of 248° C., and a flashpoint of 143.7° C. Ethylene carbonate is miscible with water, alcohol, ethyl acetate, benzene, and chloroform and is soluble in ether, n-butanol, and carbon tetrachloride. Ethylene carbonate is generally considered a low toxicity solvent for dissolving many polymers and resins.

Another useful alicyclic carbonate is propylene carbonate, which, like ethylene carbonate, is odorless and colorless. Its freezing point is −49.2° C.; its boiling point, 241.7° C.; and its flashpoint, 132.5° C. Propylene carbonate is miscible with acetone, benzene, chloroform, ether, and ethyl acetate is moderately soluble in water and carbon tetrachloride. Ethylene carbonate is the preferred alicyclic carbonate because the electronegativity of its exposed oxygen is greater than that of propylene carbonate or other higher alicyclic carbonates. Mixtures of ethylene and propylene carbonate might be used to reduce the aggressiveness of the resulting solvent in particular applications.

The electronegativity of the oxygen-containing groups of the polar compound in combination with the electronegativity of the carbonate group in the alicyclic carbonate apparently enables the solvent of the present invention to exhibit its superior cleaning ability. Molecular interactions between the solvent and the residue involves varying degrees of van der Waals forces or hydrogen bonding. These interactions are generally stronger than the molecular interactions between molecules of the residue or between the residue and the substrate. We believe that this stronger molecular interaction and affinity between the solvent and residue enables the solvent to remove the residue.

Preferably the polar solvent has at least one carbonyl oxygen, and generally it has two.

A preferred solvent of the present invention, thus, includes between about 40 to 95 parts by volume ethylene diacetate with the remainder ethylene carbonate. The preferred mixtures are liquids at or around room temperature, i.e., 20° C. The amounts of ethylene diacetate and ethylene carbonate, within the above range, will be varied primarily upon consideration of the particular cleaning task. If the material to be removed is more soluble in ethylene diacetate than ethylene carbonate, then, the concentration of the diacetate should predominate to the extent allowed within the delineated range. The converse is similarly true. A preferred mixture includes between about 50 to about 60 parts by volume ethylene diacetate and remainder ethylene carbonate. The 40–95 percent range is preferred for room temperature uses. At higher cleaning temperatures, any proportions of ethylene diacetate and ethylene carbonate that provide a liquid at the use temperature are probably acceptable.

The most preferred mixture is the eutectic composition, being essentially between about 50–55 vol % diacetate and the remainder carbonate. A eutectic mixture is desirable in many industrial cleaning applications because it allows consistent performance and retention of properties even if open tanks are used, since the composition remains constant.

As the temperature of the diacetate/carbonate mixture is lowered, the alicyclic carbonate will solidify out of the mixture until the eutectic composition is reached at which point both components will solidify simultaneously as a constant composition. Therefore, the eutectic composition has several advantages related to the handling and cleaning or reclaiming of the solvent. For instance, since the eutectic composition solidifies at a constant composition it may easily be separated and recovered from other components, like the residue or other debris, by vacuum distillation or zone recrystallization (wherein the solvent is frozen, for example, from a mixture of the solvent, residue, and a recovery fluid). Solvent extraction (even using water, if desired) is another useful method to reclaim and clean the solvent. The spent solvent, filled with residue, can usually be buried or otherwise disposed of by conventional means without special precaution or the fear of generating hazardous wastes, if reclaiming it is not an economical option.

As described earlier, the carbonate/diacetate solvent of the present invention can also include other additives that are used to address specific cleaning problems. The selection of the particular additives and the amounts used should generally be consistent with the objective of providing an aprotic solvent with a low vapor pressure that is essentially nonflammable, odorless, and nontoxic. For example, relatively high MW, saturated alcohols (such as decanol), sulfonated amines, or ethyl-3-ethoxypropionate may be added in small proportions as surfactants to decrease the surface tension of the solvent mixture. Further, propylene glycol related additive can be used to dilute the solvent to reduce its power or aggressiveness, for example, for acrylics.

Moderate to high molecular weight alcohols or esters, especially the fatty acid esters (such as lanolin), the fatty acid alcohols (such as beeswax), or other $C_8$ through $C_{20}$ alkyl alcohols, ethylene dibutyrate or other higher ethylene dialkylates, triethanolamine (TEA), N-methyl-2-pyrrolidone (NMP), or other additives that are lipophilic can be used to enhance the ability of the solvent to clean greases or oils.

When the lipophilic additive is a fatty acid ester or alcohol, it may be necessary to dissolve the additive in a low molecular weight alcohol, such as denatured ethanol, prior to adding it to the eutectic mixture. Because denatured ethanol has a toxicity greater than the preferred components, it is desirable to minimize the amount used.

Ethylene dibutyrate as a substitute for the diacetate or in conjunction with it or TEA are preferred lipophilic additives.

A particularly preferred solvent with superior environmental, safety, and cleaning properties is about 5 vol % TEA, about 5 vol % of NMP, and the remainder essentially a eutectic mixture of ethylene carbonate and ethylene diacetate. This solvent is an excellent handwipe solvent that cleans a broad range of residues effectively, even nonpolar residues. While the ratio of TEA and NMP can be varied in such a solvent, we prefer to have equal volumes of TEA and NMP, because we believe we achieve the best cleaning properties. Because both TEA and NMP are relatively expensive, we attempt to minimize their use. Five vol % of each with the eutectic mixture has proven to be a superior solvent.

When using a multicomponent mixture (i.e., the alicyclic carbonate, the polar compound, and additives), it is advantageous to use the eutectic mixture of the carbonate and polar compound. Otherwise, the multicomponent mixture's strength and properties might change significantly during use and recovery.

Referring to FIGS. 1-11, differential scanning calorimetry analysis shows that certain mixtures of ethylene diacetate and ethylene carbonate exhibit a distinct exotherm at temperatures ranging from about −38° C.

Although the reason an exotherm occurs is not fully understood, we believe that they indicate a nucleation of the diacetate and carbonate associated with the formation of a eutectic mixture. Strong molecular interaction occurs when enough energy is put into the system to allow molecular orientation of the diacetate and carbonate into a unique semicrystalline state and, we believe, prevents the individual components (particularly the carbonate) from behaving independently, complexing, and solidifying.

Figure 8:
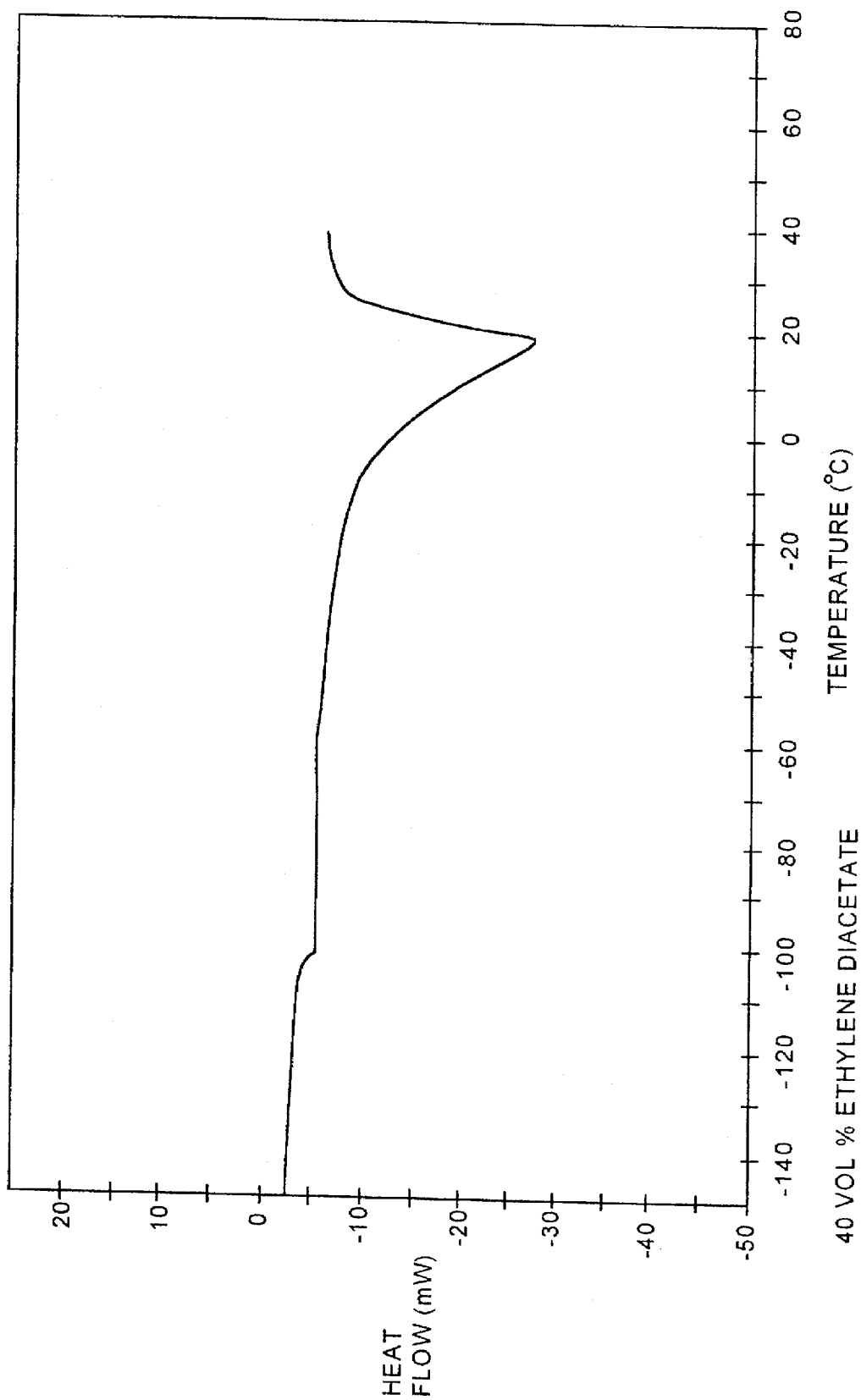

FIG. 8 (which does not show an exotherm) exhibits an endotherm at about 20° C. which indicates a portion of the ethylene carbonate solidifying out of the mixture. Nevertheless, because this mixture is still a liquid at or around room temperature (i.e., 20° C.), it is useful as a solvent within the context of the present invention. Its combination of carbonate and diacetate, although far from optimal, provides improved cleaning power over using either component alone.

Figure 9:
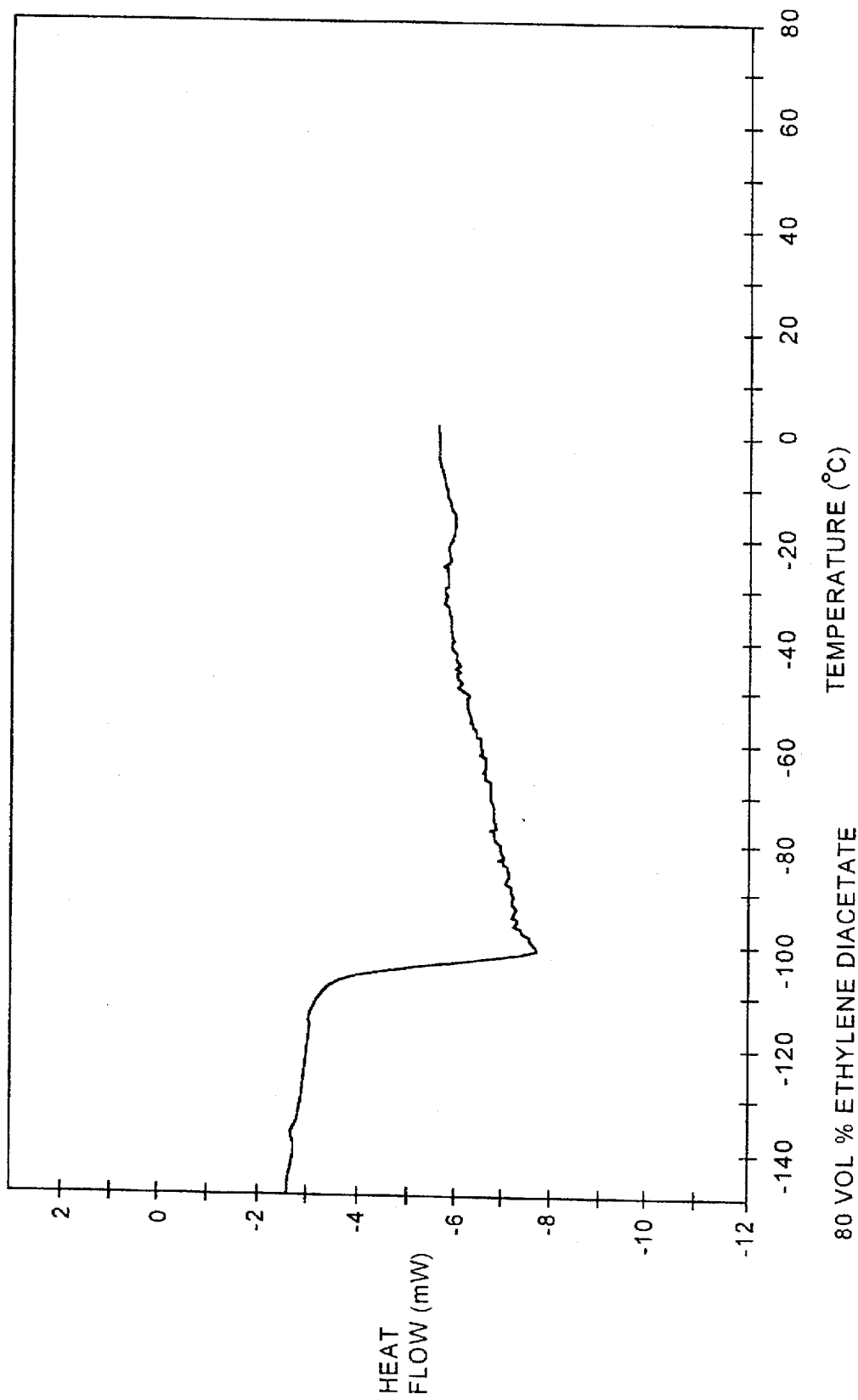
Figure 10:
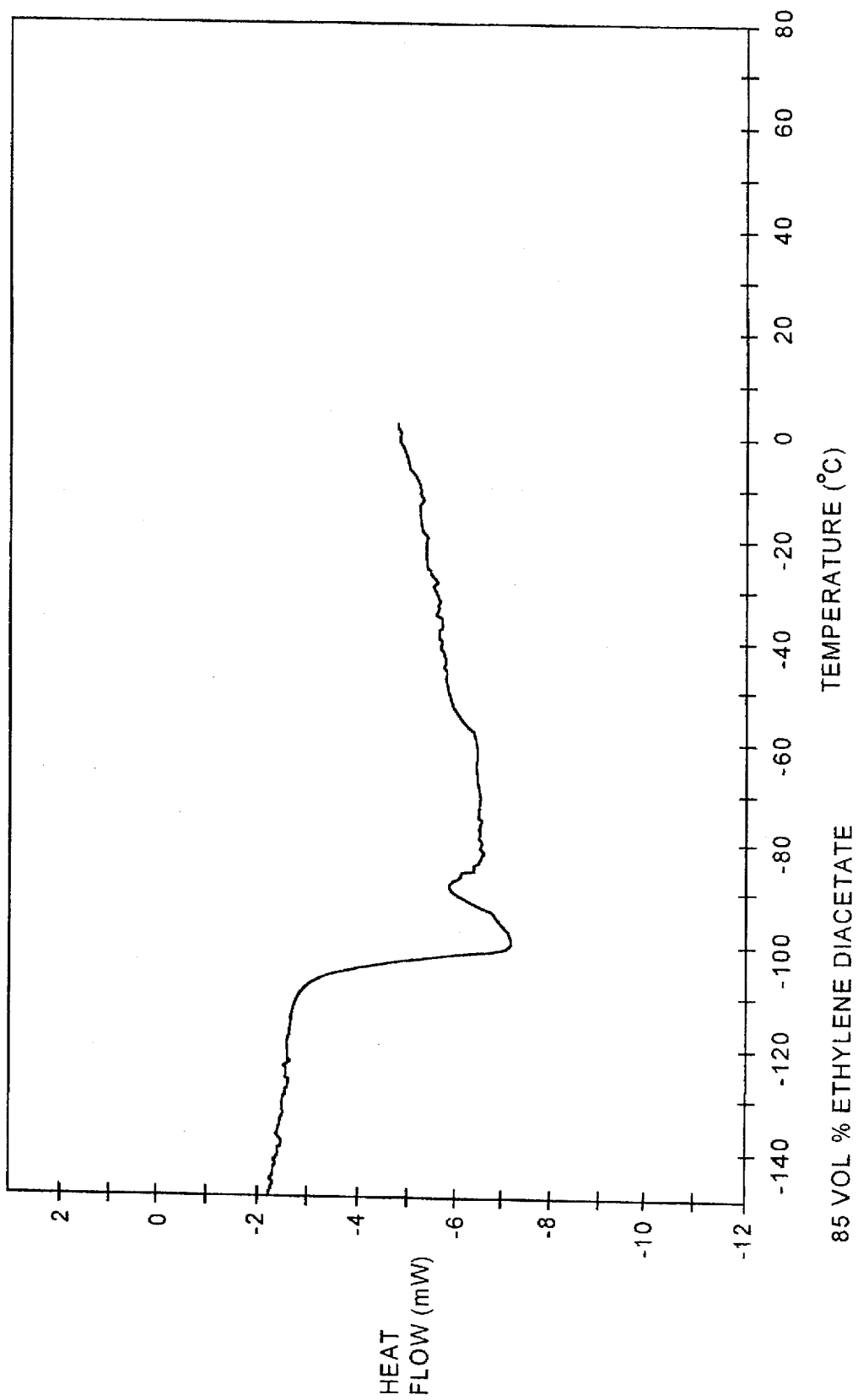
Figure 11:
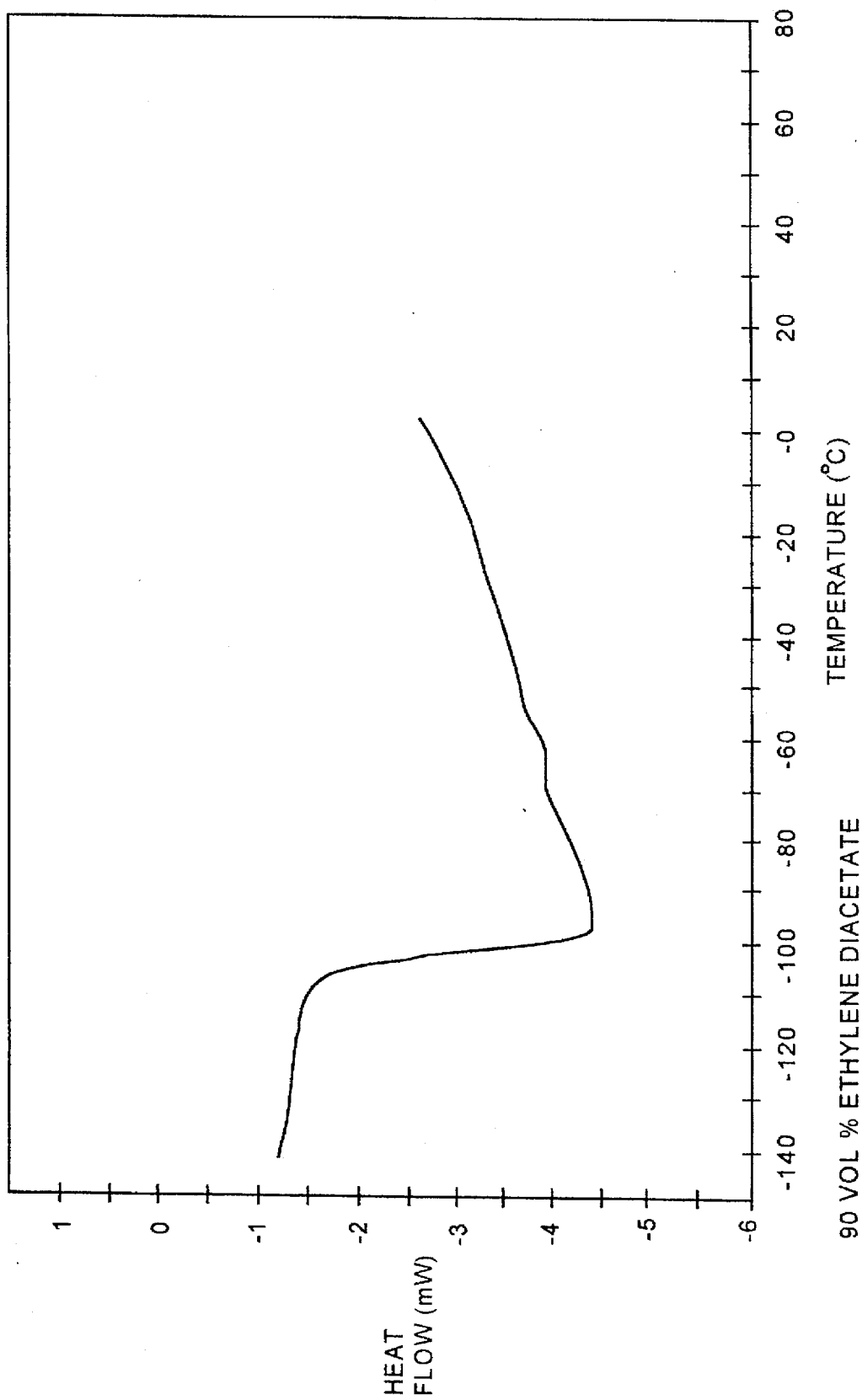

Referring to FIGS. 9-11, for higher relative concentrations of ethylene diacetate, no exotherms similar to those illustrated in FIGS. 1-7 occur, which is believed to be a result of the dominating effect the excess ethylene diacetate has on the solvent mixture. That is, although nucleation is occurring between the carbonate and diacetate molecules, the effect is masked in the differential scanning calorimeter by the excess diacetate. Nevertheless, the mixtures represented by FIGS. 9-11 still provide liquid mixtures of ethylene diacetate and ethylene carbonate that are within the scope of the present invention, because they are mixtures which have improved cleaning properties over use of either component alone. The mixture of FIG. 2 boils and evaporates to dryness at a constant boiling temperature without separate crystallization (i.e., solidification) of the ethylene carbonate, which further supports the belief that a eutectic mixture is formed.

The preferred solvents of the present invention generally have vapor pressures that are less than about 1 mm Hg at 20° C., which means that, at ambient conditions, the user will not be exposed unnecessarily to large amounts of solvent vapor and the atmosphere will not be contaminated by the escaping hydrocarbons. Conventional solvents having higher vapor pressures are, by definition, much more volatile. Further, the low vapor pressure of the mixtures translates into a decreased flammability risk, as well as virtually removing the risk of auto-ignition of the solvent vapors. In fact, the preferred solvent of diacetate and carbonate has a flashpoint greater than about 93.7° C. and would be categorized as noncombustible liquids according to OSHA standards. Both TEA and NMP, the preferred additives, also have low vapor pressures.

The preferred solvent (without additives) is essentially odorless, is substantially neutral based on ASTM-D1093 for measuring pH, and does not exhibit photochemical reactivity. In this last respect, the solvents of the present invention are a distinct improvement over conventional olefinic or aromatic solvents, particularly with respect to the environmental consequence of initiating or enhancing photochemical smog. It does not impact stratospheric ozone as chlorofluorocarbons (CFCs) do. Another advantage of the solvent of the present invention is its relatively high boiling temperature that allows the solvent to be used in heated baths or as a hot mixture without significant evaporation. We have found that immersing circuit boards coated with photoresist into an agitated, heated bath of the preferred solvent for several minutes is a simple and quick way to strip the photoresist. Generally, the solvent bath is heated to a temperature of about 100° F. (37° C.) and immersion occurs for about five minutes. Heat in this application generally results simply from the input of ultrasonic energy to provide the agitation.

The solvent of the present invention exhibits moderate solubility in water, but is not believed to be hygroscopic. The moderate solubility is advantageous because, when applied to a metals such as aluminum, the mixture will not contain excessive water. Risk of corrosion is reduced. Further, the mixture can be recovered by decanting it from water, especially when water is used to rinse the solvent from the cleaned substrate.

The preferred solvent usually is made up by adding liquified ethylene carbonate to the ethylene diacetate while stirring. Heating the mixture for a short time is recommended to ensure disassociation of the carbonate molecules and subsequent association with the diacetate. A preferred method for making up and stabilizing the solvent was developed by Dennis McCain and involves heating the mixture at about 138° F. for five minutes while stirring. Solid ethylene carbonate can be added, but it must then dissolve. The mixture is generally stable at room temperature when sealed.

The solvent can be applied with a cleaning rag or brush prior to scrubbing or it may be sprayed on. A part coated with residue can also be immersed in a bath of the solvent, as previously described, where ultrasound or other means are used to agitate the bath to speed the removal of the residue. Immersion cleaning is particularly useful for removing photoresist from circuit boards. Vapor degreasing techniques can also be used by condensing the solvent on the substrate from a vapor, although vaporizing the solvent can be costly from an energy standpoint. The amount of solvent used and the contact time required in any cleaning technique depends on the nature of the residue and the specific composition of the mixture.

The solvent of the present invention can be used as a general purpose solvent for polar and nonpolar residues, such as those generally encountered in the aerospace and electronics industries. The solvent is also an effective solvent for fingernail enamel and is not as harsh as conventional, commercial enamel removers.

The cleaning power of a preferred solvent may be best understood with reference to the following examples which are presented to illustrate features of the present invention:

EXAMPLE 1

Test panels made from 2024-T3 aluminum alloys were alodined, primed with an epoxy primer, and coated with a residue as specified in TABLE 1. A candidate cleaner was squirted onto the panel and removed with a cleaning rag by hand. A second set of test panels used a glass plate coated with the same residues as used on the alodined aluminum. Cleaning effectiveness was evaluated visually (with a 10 power microscope for the glass slides) according to the following key:

sal cleaning power for the residues tested, thereby increasing its potential for industrial use where universality is highly preferred over specificity. Notably the solvent of the present invention had little or no effect on polymeric (epoxy) paint, thereby making it a good candidate for cleaning paint sealed surfaces dirtied with other residues.

TABLE 1

CLEANING EFFECTIVENESS

| Cleaner | Residue | | | | | | | |
|---|---|---|---|---|---|---|---|---|
| | Chem Mill Oil | Ink (Sharpie) | Writing Ink | COSMOLINE | Ketchup | Lipstick | Labels | Paint |
| 1. Ethylene Carbonate/ Ethylene Diacetate | 5 | 5 | 5 | 5 | 5 | 5 | 3 | 0 |
| 2. Hot Ethylene Carbonate | 4 | 5 | 5 | 0 | 3 | 5 | 1 | 0 |
| 3. Ethylene Diacetate | 5 | 5 | 5 | 0 | 3 | 5 | 1 | 0 |
| 4. 2-Ethylhexyl Acetate | 5 | 5 | 4 | 0 | 2 | 5 | 1 | 0 |
| 5. Ethyl-3 Ethoxypropionate | 4 | 5 | 5 | 5 | 2 | 3 | 5 | + |
| 6. Triacetin | 4 | 1 | 0 | 5 | 4 | 4 | 0 | 0 |
| 7. Propylene Carbonate | 5 | 5 | 4 | 0 | 3 | 5 | 0 | 0 |
| 8. 1,2-Propylene Glycol | 0 | 5 | 4 | 0 | 3 | 5 | 0 | 0 |
| 9. Tap Hater | 0 | 0 | 0 | 0 | 1 | 0 | 0 | 0 |
| 10. Terpineol | 0 | 1 | 1 | 4 | 4 | 2 | 3 | 0 |
| 11. Methylethylketone | 5 | 5 | 5 | 5 | 2 | 2 | 5 | + |

COSMOLINE is a trademarked corrosion inhibitor of E.F. Haughton

0=no effect on residue

1=slight effect on residue

2=removes residue almost completely with rubbing and dwell time

3=removes residue completely with rubbing and dwell time

4=removes residue completely with rubbing

5=removes residue completely by pooling up prior to wiping off

+=visibly affects paint

The candidate cleaners (all of which meet basic environmental and health considerations) tested included:
1. 46 vol % ethylene carbonate and 54 vol % ethylene diacetate (i.e., the solvent of the present invention)
2. Hot ethylene carbonate
3. Ethylene diacetate
4. 2-Ethylhexyl acetate
5. Ethyl-3-ethoxypropionate
6. Triacetin
7. Propylene carbonate
8. 1,2-Propylene glycol
9. Tap water.

The result of these cleaning experiments are set forth in TABLE 1.

Terpineol is an unsaturated hydrocarbon, a factor virtually eliminating it from serious consideration. We tested it anyway in accordance with the method of Example 1 and determined that it had poor cleaning power. MEK was tested for purposes of comparison. It is the benchmark solvent that the solvent of the present invention is designed to replace. The results for terpineol and MEK are also set forth in TABLE 1.

The solvent of the present invention cleans as well or better than the other solvents tested. Although removal of labels was difficult, the solvent exhibited essentially univer-

EXAMPLE 2

Plastic panels made from the resins listed in TABLE 2 were immersed in the listed solvents for a period of 168 hours (one week) to test the effect of the solvents on the plastic. The results were visually observed and recorded according to the following key:

++=major effect

+=some effect

−=no effect

The solvents tested were:

1. 46 vol % ethylene carbonate and 54 vol % ethylene diacetate
2. Propylene carbonate
3. Ethylene diacetate
4. 2-Ethylhexyl acetate
5. 1,2-Propylene glycol
6. Ethyl-3-ethoxypropionate
7. Triacetin
8. Terpineol The preferred solvent of the present invention did not adversely affect any plastic substrate tested. While the solvent does attack solvent-sensitive plastics (principally through its diacetate component), it is usable on nearly all high performance composites, thereby making it usable in aerospace applications. MEK is known to attack engineering plastics.

TABLE 2

EFFECT ON PLASTIC

| | Resin | | | | | | |
|---|---|---|---|---|---|---|---|
| Cleaner | Acrylic-Lucite | Polycarb/Lexan | PTFE/Teflon | PVF/Tedlar | Mylar | Fiber/Epoxy Composite | Aramid/Kevlar |
| 1. Ethylene Carbonate/Ethylene Diacetate | − | − | − | − | − | − | − |
| 2. Propylene Carbonate | − | − | + | − | − | − | − |
| 3. Ethylene Diacetate | − | − | − | − | − | − | − |
| 4. 2-Ethylhexyl Acetate | − | − | − | − | − | − | − |
| 5. 1,2-Propylene Glycol | − | − | − | − | − | − | − |
| 6. Ethyl-3-Ethoxy Propionate | + | − | − | − | − | − | − |
| 7. Triacetin | − | − | − | − | − | − | − |
| 8. Terpineol | − | − | − | − | − | − | − |

| | Resin | | | | | |
|---|---|---|---|---|---|---|
| Cleaner | ABS/Royalite 50 | Poly-Sulfone Royalite 520 | PVC | Poly-acetal | Phenolic | Nylon |
| 1. Ethylene Carbonate Ethylene Diacetate | − | − | − | − | − | − |
| 2. Propylene Carbonate | + | − | − | − | − | − |
| 3. Ethylene Diacetate | + | − | − | − | − | − |
| 4. 2-Ethylhexyl Acetate | + | − | − | − | − | − |
| 5. 1,2-Propylene Glycol | − | − | − | − | − | − |
| 6. Ethyl-3-Ethoxy Propionate | ++ | − | + | − | − | − |
| 7. Triacetin | − | − | − | − | − | − |
| 8. Terpineol | − | − | − | − | − | − |

EXAMPLE 3

A 46 vol % mixture of ethylene carbonate in ethylene diacetate was tested for its effectiveness in removing Kodak KPR3™ and DuPont RISTON™ photoresist and Kodak Thin Film Resist (KTF™) from electronic circuitry equipment by contacting the photoresist and etch resist with the solvent. The solvent mixture removed KPR3™ and RISTON™ photoresist effectively upon 30 minutes of soaking without scrubbing. The removal was accelerated by heating the solvent. The solvent performed poorly on the Kodak Thin Film Resist after a similar treatment, and may not be a suitable solvent for this residue.

EXAMPLE 4

A mixture of ethylene diacetate and ethylene carbonate was applied to an evaporative wood finish (i.e., varnish, lacquer, or shellac) and allowed to stand for several minutes to soften the finish. Upon wiping, the coating was easily removed.

EXAMPLE 5

A multicomponent mixture of ethylene diacetate, ethylene carbonate, and triethanolamine (TEA), effective as a degreaser, was prepared by mixing about 5–10 parts by volume TEA with about a 50:50 vol % mixture of ethylene carbonate and ethylene diacetate. This mixture was then applied to a greasy residue comprising MIL-L-7870 oil on the surface of aluminum (or an alloy) and removed with a cleaning rag. The grease was essentially completely removed with mild rubbing.

The multicomponent mixture cleaned this greasy surface more effectively than a simple mixture of ethylene diacetate and ethylene carbonate presumably because the triethanolamine, being a lipophilic additive, complexed with the grease to assist the carbonate and diacetate to remove it.

The multicomponent mixture exhibited the following chemical and physical properties:

vapor pressure: <1 mm Hg at 20° C.;

essentially colorless and odorless; and essentially nonflammable.

While we believe that other trialkylamines would also prove effective for this purpose, we prefer to use TEA for its convenience (insofar it is readily available commercially), its low toxicity, and its low vapor pressure. Because of its cost, however, the amount used should be minimized.

EXAMPLE 6

In a solvent mixture, up to about 25 parts by volume ethylene dibutyrate were added to a mixture of the preferred diacetate/carbonate solvent of Example 5 to increase the lipophilic nature of the mixture by doubling the length of the hydrocarbon chains pendent from the carbonyl groups of the diester. The resulting mixture was applied to a greasy substrate following the same general steps as used in Example 5. This mixture was also an improved degreaser, presumably because of the higher molecular weight and chemical properties of the pendent butyrate groups. It is much safer to use than the FREON degreasers (CFCs) commonly used today for this same cleaning operation.

EXAMPLE 7

A multicomponent mixture of ethylene diacetate, ethylene carbonate, TEA, and N-methyl-2-pyrrolidone (NMP) was prepared by mixing about 5 vol % TEA and 5 vol % NMP with the remainder about a 50:50 vol % mixture of the carbonate and diacetate. The mixture was tested on MIL-L-7870 oil and found to be a superior cleaner, especially for greases, but having widespread solvency for industrial debris.

EXAMPLE 8

About 5–10 vol % NMP, was mixed with about a 50:50 vol % mixture of carbonate and diacetate. The resulting mixture was tested on MIL-L-7870 oil in accordance with Examples 5 or 7. While an effective cleaner, we prefer the 4-component mixture of Example 7 principally because it is able to achieve superior performance with a smaller amount of expensive NMP than would otherwise be required if TEA were not also included.

EXAMPLE 9

A circuit board coated with Kodak KPR3 photoresist was immersed on a bath of ethylene carbonate and ethylene diacetate in accordance with Example 3. The bath was agitated with ultrasonic energy for several minutes to strip the photoresist from the board.

The present invention, then, provides an aprotic, liquid solvent that is a nontoxic, nonflammable, and an effective alternative to conventional cleaning solvents like MEK, halogenated hydrocarbons (particularly the FREONs), or olefinic or aromatic hydrocarbons. The preferred mixture of ethylene carbonate and ethylene diacetate out performs other environmentally acceptable candidate solvents without harming the substrate, be it ceramic, glass, or plastic. Examples 1 and 2 show that any mixture of ethylene carbonate with ethylene diacetate out performs either ethylene carbonate or ethylene diacetate alone. In its preferred concentrations, the solvent is a suprisingly effective solvent for most industrial cleaning applications, including removal of photoresist.

Additives such as acetic acid introduce replaceable hydrogens to the solvent, thereby altering its aprotic character. Accordingly, these additives are not preferred for universal applications, but are contemplated as desirable for specific cleaning problems where corrosion is less of a concern. We prefer to minimize the amount of these protic additives even when they are added to solve a particular cleaning problem. In many circumstances it is unimportant whether the solvent is aprotic. For those circumstances, nevertheless, where corrosion is an important concern, the preferred diacetate/carbonate solvent and, optionally, that with either or both of TEA and NMP is a powerful, safe nonhazardous, nontoxic, and effective cleaner with widespread applicability. Although the alcoholic —OH is not preferred, it is aprotic and compounds that include it, like TEA or the glycols, can be used without significantly increasing the corrosiveness of the solvent. These alcohols, however, may alter the toxicity of the solvent.

Various changes, substitutions, or alterations of the described embodiments might be made without departing from the broad, inventive concepts that are disclosed. The examples are provided to illustrate the invention and are not intended to limit it. The claims should be construed broadly in light of the description to include all described embodiments and their equivalents and should only be limited as required by the relevant prior art.

I claim:

1. A method for removing photoresist comprising the step of contacting a part that is coated with photoresist with an effective amount of a solvent to remove the photoresist while ultrasonically agitating the solvent, wherein the solvent comprises:

(a) 40–50 vol % of at least one aprotic, alicyclic carbonate, the carbonate including ethylene carbonate; and (b) an effective amount of at least one aprotic polar compound selected from the group consisting of alkyl diesters, alkyl diethers, alkyl compounds containing both ester and ether groups, and mixtures thereof, the solvent being effective at removing photoresist by immersion of the photoresist-coated part in an ultrasonically agitated bath;

the polar compound including ethylene diacetate, ethylene dibutyrate, or mixtures thereof; and the solvent including N-methyl-2-pyrrolidone and triethanolamine.

2. The method of claim 1 wherein the step of contacting includes immersing the part in the solvent.

3. The method of claim 2 further comprising the step of agitating the solvent and part during the immersion.

4. The method of claim 3 further comprising the step of heating the solvent.

5. The method of claim 1 wherein the ratio of carbonate to polar compound is about 50–60 vol % polar compound and 40–50 vol % carbonate.

6. The method of claim 1 wherein the solvent comprises about 5 vol % triethanolamine, about 5 vol % N-methyl-2-pyrrolidone, and the remainder about a 50:50 vol % mixture of ethylene carbonate and ethylene diacetate.

7. The method of claim 1 where the solvent comprises substantially a eutectic mixture of ethylene carbonate and ethylene diacetate.

* * * * *